United States Patent [19]

Nelsen et al.

[11] Patent Number: 4,964,959

[45] Date of Patent: Oct. 23, 1990

[54] PROCESS FOR PREPARING A NONCONDUCTIVE SUBSTRATE FOR ELECTROPLATING

[75] Inventors: Barry F. Nelsen, Mountain Lakes, N.J.; Jieh-Hwa Shyu, Windham, N.H.

[73] Assignee: Olin Hunt Specialty Products Inc., Cheshire, Conn.

[21] Appl. No.: 507,811

[22] Filed: Apr. 12, 1990

[51] Int. Cl.$^5$ .......................... C25D 5/02; C25D 5/54
[52] U.S. Cl. .......................... 204/15; 204/20; 204/26
[58] Field of Search .................. 204/15, 20, 26, 38.4

[56] References Cited

U.S. PATENT DOCUMENTS

| | | | |
|---|---|---|---|
| 1,037,469 | 9/1912 | Goldberg | 427/123 |
| 1,352,331 | 9/1920 | Unno | 204/31 |
| 2,243,429 | 5/1941 | Leipzig | 204/30 |
| 3,099,608 | 7/1963 | Radovsky et al. | 204/15 |
| 3,163,588 | 2/1955 | Shortt et al. | 204/16 |
| 4,035,265 | 7/1977 | Saunders | 252/510 |
| 4,090,984 | 5/1978 | Linn et al. | 252/511 |
| 4,239,794 | 12/1980 | Allard | 428/219 |
| 4,619,741 | 10/1986 | Minten et al. | 204/15 |
| 4,622,107 | 11/1986 | Piano | 204/15 |
| 4,622,108 | 11/1986 | Polakovic et al. | 204/15 |
| 4,631,117 | 12/1986 | Minten et al. | 204/15 |
| 4,684,560 | 8/1987 | Minten et al. | 428/131 |
| 4,718,993 | 1/1988 | Cupta et al. | 204/15 |
| 4,724,005 | 2/1988 | Minten et al. | 106/307 |
| 4,874,477 | 10/1989 | Pendleton | 204/15 |

FOREIGN PATENT DOCUMENTS

WO890837 5/1989 PCT Int'l Appl. ............. 204/15

*Primary Examiner*—T. M. Tufariello
*Attorney, Agent, or Firm*—Donald M. Papuga

[57] ABSTRACT

Described herein is an improved process for electroplating a conductive metal layer to the surface of a nonconductive material comprising the following steps:

(a) preparing a liquid dispersion of carbon black comprised of:
  (1) carbon black particles having an average particle diameter of less than about 3.0 microns in said dispersion;
  (2) an effective dispersing amount of a surfactant which is compatible with said carbon black; and
  (3) liquid dispersing medium, wherein the amount of carbon black is sufficient to coat substantially all of said nonconducting surfaces and is less than about 4% by weight of said liquid dispersion;

(b) applying said liquid dispersion to the surface of the nonconducting material;

(c) separating substantially all of said liquid dispersing medium from said carbon black particles, whereby said particles are deposited on said nonconductive surface in a substantially continuous layer; and (d) electroplating a substantially continuous conductive metal layer over the deposited carbon black layer and said nonconductive surface, wherein the improvement comprises adding an organic ionomer or polymer salt to the liquid dispersion in step (a).

28 Claims, No Drawings

PROCESS FOR PREPARING A NONCONDUCTIVE SUBSTRATE FOR ELECTROPLATING

1. Field of the Invention

This invention is directed to an improved process for electroplating a conductive metal to the surface of a nonconductive material.

2. Background of the Invention

Conventional electroless processes have several commercial disadvantages. They require a relatively long process time. The multiple treatment baths have complex chemistry which may require constant monitoring and individual ingredients which may require separate replenishment. The conventionally used palladium/tin activator also may require expensive waste treatment. Furthermore, these electroless process baths may be very sensitive to contamination. Finally, the multiplicity of rinse baths may require large amounts of water.

Prior to the electroless method of plating through holes, graphite was employed to prepare the walls of the through holes for plating. For example, U.S. Pat. No. 3,099,608, which issued to Radovsky et al. on July 30, 1963, teaches a process for preparing the through hole walls of printed circuit boards for electroplating by initially depositing in said through holes a thin electrically nonconductive film of palladium metal in at least a semi-colloidal form. The patent discloses that graphite had been used previously as a conductive layer for electroplating thereon. See column 1, lines 63–70 and column 4, line 72 to column 5, line 11. These patentees noted several deficiencies with that graphite process including lack of control of the graphite application, poor deposit of the resultant electroplated metal, nonuniform through hole diameters, and low electrical resistance of the graphite.

U.S. Pat. No. 3,163,588, which issued to Shortt et al. on Dec. 29, 1964, also mentions that graphite or its equivalents may be employed to render through hole walls of electric circuit boards conductive for later electroplating metals thereon. See column 3, line 45 to column 4, line 2.

U.S. Pat. No. 4,581,301, which issued to Michaelson on Apr. 8, 1986, teaches the application of a seed layer of conductive particles, such as "carbon", on the walls of through holes before electrolytically plating copper over the seed layer. This reference does not explicitly teach the use of a continuous layer of carbon black dispersion in the seed layer, and does not recognize the advantage of using very small particles of carbon black such as presently claimed. See column 7, lines 63–66 which refer to particles passing through a 400 mesh screen. A 400 mesh screen is equivalent to about 35 microns.

Separately, graphite has been employed in numerous processes for preparing a nonconducting material for a metal coating or plating. For example, U.S. Pat. No. 409,096, which issued to Alois Blank on Aug. 13, 1889, teaches a process for applying copper to asbestos roofing material which comprises first applying powdered plumbago (graphite) in a volatile liquid such as varnish to the surface of the asbestos, then evaporating the volatile liquid to coat the asbestos fibers with fine particles of plumbago. The plumbago coated asbestos sheets are then immersed in a copper electroplating solution and electric current is applied to the coated asbestos sheet to form a thin film of copper thereon. The copper coated sheet is then immersed in a bath of molten metal such as tin, lead, or zinc, and is then removed from the molten bath to effect solidification of the molten metal. The resulting metal coated asbestos sheet is described as being relatively flexible, a nonconductor of heat and substantially fireproof.

U.S. Pat. No. 1,037,469, which issued to Goldberg on Sept. 3, 1912, and U.S. Pat. No. 1,352,331, which issued to Unno on Sept. 7, 1920, disclose processes for electroplating nonconducting materials by first coating the nonconducting material with wax, then coating the wax with a slurry of finely divided particles of graphite or other metal, followed by electroplating of the dust-coated surface with copper or other metal. Neither of these processes are particularly suitable for use in coating the hole walls of circuit boards because the holes are normally extremely narrow in diameter and immersing in wax would tend to plug the hole and prevent coating the hole walls with an electroplating material.

U.S. Pat. No. 2,243,429, which issued to Laux on May 27, 1941, discloses a process for electroplating a nonconductive surface by "graphiting" a thin layer onto the nonconducting surface followed by applying a copper layer electrolytically and "finally a further electrolytic deposit of another metal" is placed thereon.

Separately, carbon black formulations have been employed as conductive coatings for nonconductive materials. For example, U.S. Pat. No. 4,035,265, which issued to Saunders on July 12, 1977, discloses conductive paint compositions containing both graphite and carbon black along with air-hardenable binder. These paints are suitable for application to the walls of a building for use as a heating element.

U.S. Pat. No. 4,090,984, which issued to Lin et al. on May 23, 1978, teaches a semi-conductive coating for glass fibers comprising (a) a polyacrylate emulsion; (b) electrically conductive carbon black dispersion and (c) a thixotropic gelling agent. The conductive carbon black dispersions employed are those comprising electrically conductive carbon black dispersed in from about 3 to about 4% by weight of a suitable dispersing agent.

U.S. Pat. No. 4,239,794, which issued to Allard on Dec. 16, 1980, teaches dispersing a conductive carbon black in a latex binder with a selected dispersing agent, then impregnating this carbon black dispersion into a nonwoven fibrous web followed by drying any residual water, leaving a thin coating of carbon black dispersed on the surfaces of said fibers.

PCT publication No. WO 89/08375 published Sept. 8, 1989 describes a process for producing plated through-hole printed circuit boards without using electroless copper.

The process is characterized in that:

(a) the surfaces of the substrate are pretreated in a solution having oxidizing activity, (b) after removal of the residual solution by rinsing, the substrate is introduced into a solution which contains at least one monomer, and more specifically pyrrole, furane, thiophene or derivative(s) thereof, which in a polymeric or copolymeric form is electrically conductive, (c) the substrate is then transferred into an acidic solution whereby an electrically conductive polymeric layer, more specifically of polymerized or copolymerized pyrrole, furane, thiophene or derivative(s) thereof, whereupon, if desired or required, any residual solution is removed by rinsing, and the galvanic or electroless metallization is carried out.

U.S. Pat. No. 4,619,714, issued Oct. 28, 1986, and U.S. Pat. Nos. 4,684,560, issued Aug. 4, 1987 and 4,724,005, issued Feb. 9, 1988, both of which are divisions of U.S. Pat. No. 4,619,714, describe a process for electroplating a conductive metal to the surface of a nonconductive material, particularly a process of electroplating the through holes of a printed wiring board. This process is a significant improvement over the known electroless techniques. By this process, a liquid dispersion of carbon black particles is first applied to the nonconductive material, such as the nonconductive portions of through holes on a printed wire board; then the liquid dispersion medium is separated (i.e., evaporated) from the carbon black particles, thereby depositing a substantially continuous layer of carbon black particles on the nonconductive surface; and next a substantially continuous metal layer is electroplated over the deposited carbon black layer. This process of U.S. Pat. No. 4,619,714 has several advantages over the known electroless techniques including the elimination of the preactivator, the Pd/Sn activator, and the accelerator; less possibility of pollution problems; better bath stability; and fewer possible side reactions.

Improvements and modifications of the electroplating process of U.S. Pat. No. 4,619,741 are described in the following patents:

U.S. Pat. No. 4,622,107, issued Nov. 11, 1986, describes the use of a gas-forming compound (e.g., sodium carbonate) to remove loosely or easily removable carbon black particles in the through holes.

U.S. Pat. No. 4,622,108, issued Nov. 11, 1986, describes the contacting of an alkaline hydroxide preconditioning solution to the through-hole walls before application of the carbon black dispersion so that the carbon black dispersion will have better adhesion to the walls.

U.S. Pat. No. 4,631,117, issued Dec. 23, 1986, describes the use of the carbon black dispersion described in U.S. Pat. No. 4,619,714 as a preactivator for electroless plating of the through holes.

U.S. Pat. No. 4,718,993, issued Jan. 12, 1988, describes the use of an aqueous alkaline silicate solution to contact a printed wiring board prior to contacting with the carbon black dispersion.

U.S. Pat. No. 4,874,477, issued Oct. 17, 1989, describes contacting a printed wire board with a particular aqueous polyelectrolyte homopolymer conditioner followed by contacting the printed wiring board with the carbon black dispersion.

U.S. Pat. No. 4,897,164, issued Jan. 30, 1990, describes contacting a printed wiring board with an aqueous solution of an alkali metal borate after it has been contacted with the carbon black dispersion and prior to microetching.

All of the disclosures of said patents are incorporated herein by reference.

While the above patents describe effective means for electroplating a conductive metal to the surface of a nonconductive material, particularly electroplating, the through holes of a printed wire board, there is still a desire to improve the overall quality of the electroplating process.

In the present invention, it has been found that the conductivity of carbon black particles, used in the process of U.S. Pat. No. 4,619,741, discussed above, can be increased by treating the carbon black particles with an organic ionomer or polymer salt. Treatment of the carbon black in such a manner results in more uniform metal deposition in electroplating and faster electroplating.

Specifically, the improved process of this invention for electroplating a conductive metal layer to the surface of a nonconductive material comprises the following steps:

(a) preparing a liquid dispersion of carbon black comprised of:

(1) carbon black particles having an average particle diameter of less than about 3.0 microns in said dispersion;

(2) an effective dispersing amount of a surfactant which is compatible with said carbon black; and (3) liquid dispersing medium, wherein the amount of carbon black is sufficient to coat substantially all of said nonconducting surfaces and is less than about 4% by weight of said liquid dispersion;

(b) applying said liquid dispersion to the surface of the nonconducting material;

(c) separating substantially all of said liquid dispersing medium from said carbon black particles, whereby said particles are deposited on said nonconductive surface in a substantially continuous layer; and (d) electroplating a substantially continuous conductive metal layer over the deposited carbon black layer and said nonconductive surface, wherein the improvement comprises adding an organic ionomer or polymer salt to the liquid dispersion in step (a).

This process entails placing a selected liquid dispersion containing carbon black particles which particles have been treated with an organic ionomer or polymer salt over the surface of a nonconductive material, particularly the nonconducting portions of the through-hole walls in a printed wiring board before electroplating. After the dispersion medium has been removed and the carbon black particles have been deposited on the nonconductive material, a substantially continuous conductive metal layer is deposited over the deposited carbon black layer and nonconductive surface by electroplating. The result is more uniform metal deposition and faster electroplating than processes which do not use treated carbon black particles.

Printed wiring boards (also known as printed circuit boards) are generally laminated materials comprised of two or more plates or foils of copper, which are separated from each other by a layer of nonconducting material. Although copper is generally used as the electroplating metal in printed wiring boards, those skilled in the art will recognize that other metals such as nickel, gold, palladium, silver and the like can also be electroplated by the process of this invention. The nonconducting layer or layers are preferably an organic material such as an epoxy resin impregnated with glass fiber particles. However, the nonconducting layer may also be comprised of thermosetting resins, thermoplastic resins, and mixtures thereof, with or without reinforcing materials such as fiberglass and fillers.

Suitable thermoplastic resins include the acetal resins; acrylics, such as methYl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrile styrene co-polymers and acrylonitrile-butadiene-styrene (ABS) co-polymers; polycarbonates; polychlorotrifluoro ethylene; and vinyl polymers and co-polymers, such as vinyl acetate, vinyl alcohol, vinyl butyral, vinyl chloride, vinyl chloride-acetate co-polymer, vinylidene chloride and vinyl formal; and the like.

Suitable thermosetting resins include alkyl phthalate, furane; melamine-formaldehyde; phenol formaldehyde and phenol-furfural co-polymers; alone or compounded with butadiene acrylonitrile co-polymer or acrylonitrile-butadiene-styrene (ABS) co-polymers; polyacrylic esters; silicones; urea formaldehydes; epoxy resins; polyimides; alkyl resins; glyceryl phthalates; polyesters; and the like.

In many printed wiring board designs, the electrical pathway or pattern requires a connection between the separated copper plates at certain points in the pattern. This is usually accomplished by drilling holes at the desired locations through the laminate of copper plates and the nonconducting layer and then connecting the separate metal plates. The hole diameters of printed wiring boards generally range from between about 0.5 and about 10 millimeters in diameter, and preferably from about 1 to about 5 millimeters.

After drilling these through holes, it may be desirable to deburr the holes to make the hole walls relatively smooth. In the case of multilayer printed wiring boards, it may also be desirable to subject the boards to a desmear or etchback operations to clean the inner copper interfacing surfaces of the through holes. Suitable preparative operations include any or all of the presently available conventional operations including conventional permanganate desmearing processes.

Once the surfaces of through holes have been made relatively smooth for plating, it is preferred to subject the PWB to a precleaning process in order to place the printed wiring board in condition for receiving the liquid carbon black dispersion. In one preferred precleaning operation, the printed wiring board is first placed in a cleaner/conditioner bath for about 1 to 10 minutes at a temperature of about 45° C. to about 70° C. to remove grease and other impurities from the hole wall surfaces. In this embodiment, one preferred cleaner is comprised of monoethanolamine, a nonionic surfactant and ethylene glycol in water; which is available as "BLACKHOLE Cleaner 2" from the Olin Hunt Specialty Products Inc. of West Paterson, N.J.

After the application of the cleaner, the PWB is subsequently rinsed in water to remove excess cleaner from the board and then contacted with a conditioner solution. The preferred method of contacting with a conditioner is dipping the cleaned PWB into a room temperature aqueous conditioner bath for about 1–10 minutes. This conditioner solution is used to ensure that substantially all of the hole wall glass/epoxy surfaces are properly prepared to accept a continuous layer of the subsequent carbon black particles. Such conditioner solutions have been customarily used in electroless processing to precondition the boards for the electroless chemistry. See U.S. Pat. No. 4,634,691, which issued to Lindsey on Jan. 6, 1987, for a discussion of conditioner solution. The Lindsey patent is incorporated herein by reference in its entirety. One preferred conditioner is "BLACKHOLE Conditioner" available from Olin Hunt Specialty Products Inc. of West Paterson, N.J. This conditioner formulation comprises the mixture of monoethanolamine and a polyamine resin in water and has a PH of about 10. The preferred concentration of total conditioner ingredients in water is from about 1% to about 10% by weight.

If the cleaner solution precedes the aqueous cleaner solution, it is preferred to rinse the treated board in a water rinse between the cleaner solution and the conditioner solution. It is also preferred to use a water rinse bath after the conditioner treatment.

The liquid carbon black dispersion is next applied to or contacted with the conditioned PWB. This dispersion contains three critical ingredients, namely, carbon black, one or more surfactants capable of dispersing the carbon black and a liquid dispersing medium such as water. The preferred method of applying the dispersion to the PWB include immersion, spraying or other methods of applying chemicals used in the PWB industry. A single working bath is sufficient for applying this carbon black dispersion; however, more than one bath may be used for rework or other purposes.

In preparing this liquid dispersion, the three critical ingredients and any other preferred ingredients are thoroughly mixed together to form a stable dispersion. This may be accomplished by subjecting a concentrated form of the dispersion to ball milling, colloidal milling, high-shear milling, ultrasonic techniques or other standard blending techniques. The thoroughly mixed dispersion is later diluted with more water while agitating to the desired concentration for the working bath. The preferred method of mixing is ball milling a concentrated form of the dispersion in a container having glass, mineral, or plastic beads therein for a period of about 1 to about 24 hours. This thorough mixing allows for the carbon black particles to be intimately coated or wetted with the surfactant. This mixed concentrate is then mixed with water or some other liquid dispersing medium to the desired concentration. The working bath is preferably kept agitated during both the diluting and applying steps to aid in keeping the dispersion stable.

As stated above, the carbon black particles should have an average particle diameter below about 3 microns while in the dispersion. It is desirable to have this average particle diameter of carbon black as small as possible to obtain the desired plating characteristics of substantially even plating and no plating pullaways. It is preferred that the carbon black particles have an average particle diameter from about 0.1 to about 3.0 microns, more preferably from 0.2 to about 2.0 microns, in said dispersion. The term "average particle diameter" as employed herein in both the specification and claims refers to average mean diameter of the particles (the average by number). The average mean diameter in the dispersion may be determined through the use of either a NiComp Model 270 submicron particle size analyzer (Version 3.0) or a HIAC PA-720 automatic particle size analyzer (both available from the HIAC/ROYCO Instrument Division of Pacific Scientific of Menlo Park, Calif.).

All types of carbon blacks may be used for this invention including the commonly available furnace blacks. However, it is preferred to utilize carbon blacks which are initially acidic or neutral, i.e., those which have a pH of between about 1 and about 7.5 and more preferably between about 2 and about 4 when slurried with water. Carbon black particles of the preferred type contain between about 1% and about 10% by weight of volatiles and have an amorphous structure.

These preferred carbon black particles are also very porous and generally their surface areas are from between about 45 to about 1100, and preferably between about 300 to about 600, square meters per gram as measured by the BET method (method of Brunauer-Emmett-Teller).

Illustrative carbon blacks suitable for use of this invention include Cabot XC-72R Conductive, Cabot Monarch 800, Cabot Monarch 1300, all manufactured by Cabot Corporation of Boston, Mass. Other suitable carbon blacks include Columbian T-10189, Columbian Conductex 975 Conductive, Columbian CC-40-220, and Columbian Raven 3500, all available from Columbian Carbon Company of New York, N.Y. Monarch 800 and Raven 3500 are the two most preferred carbon blacks because of their ease of dispersion and low PH.

The carbon black particles are treated with an organic inomer or polymer salt. These include the salts of polyaniline, polyethyleneimines, sulfonated petroleum, 3-alkylpolythiopene, polypyrrole, poly(N-alkyl pyrrole), poly(3-alkyl pyrrole), polyisophianaphthlene, polyphosphagene, polyacetylene, and the like, and combinations thereof. The preferred salts include polyaniline hydrochloride, polyaniline sulfate, quaternary polyethyleneimines, and the barium salt of sulfonated petroleum. These salts are known in the art. The preparation of substituted polyaniline is described in U.S. Pat. No. 3,963,498, which is incorporated herein by reference.

An efficient way to coat the carbon black is to first dissolve the isolated polyaniline salt in an appropriate solvent such as an ether, a ketone, or alcohol as described in U.S. Pat. No. 3,963,498. Carbon black is added as above, and the polyaniline salt adsorbs onto the surface of the carbon black. The dispersion is then filtered and the solids are redispersed in water. Alternatively, the salt may be added to the dispersion containing the carbon black.

The term "liquid dispersing medium" as used herein in the present specification and claims includes water and polar organic solvents (both protic and aprotic). Suitable protic polar organic solvents may include lower alcohols ($C_1$-$C_4$) such as methanol, ethanol, isopropanol and isobutanol; polyhydric alcohols such as glycols (i.e. triethylene glycols); ether-alcohols such as cellosolve; organic acids, such as formic acid and acetic acid; acid derivatives such as trichloroacetic acid; and sulfonic acids such as methane sulfonic acid. Suitable aprotic polar organic solvents include aldehydes such as acetaldehyde; ketones such as acetone; aprotic aromatic solvents such as toluene and mineral spirits; aprotic halogenated hydrocarbons such as dichlorofluoromethane and dichlorodifluoromethane (FREON); dimethylformamide (DMF); N-methyl-pyrolidone; dimethylsulfoxide (DMSO); and esters of carboxylic acids such as methylformate, ethylacetate and cellosolve acetate. The preferred liquid dispersing medium is water because of cost and ease of use considerations. It is preferred to utilize deionized water which is free of lime, fluorine, iodine and other impurities normally found in tap water, in order to minimize interference of foreign ions during the subsequent electroplating step.

In addition to the water and carbon black, a third critical ingredient is needed in the dispersion, namely, a surfactant capable of dispersing said carbon black in said liquid dispersing medium (i.e., compatible with said carbon black and liquid dispersing medium). One or more of these is added to the dispersion in order to enhance the wetting ability and stability of the carbon black and permit maximum penetration by the carbon black within the pores and fibers of the nonconducting layer. Suitable wetting agents include anionic, nonionic and cationic surfactants (or combinations thereof such as amphoteric surfactants). The surfactants should be soluble, stable and preferably nonfoaming in the liquid carbon black dispersion. In general, for a polar continuous phase as in water, the surfactants should preferably have a high HLB number (8–18). The preferred type of surfactant will depend mainly on the pH of the dispersion. If the total dispersion is alkaline (i.e., has an overall pH in the basic range), it is preferred to employ an anionic or nonionic surfactant. Acceptable anionic surfactants include sodium or potassium salts of naphthalene sulfonic acid such as DARVAN No. 1 (R. T. Vanderbilt Co.), ECCOWET LF (Eastern Color and Chemical), PETRO AA, PETRO ULF (Petro Chemical Co., Inc.), and AEROSOL TO (American Cyanamid). Preferred anionic surfactants include neutralized phosphate ester-type surfactants such as MAPHOS 55, 56, 8135, 60A, L6 (Mazer Chemicals Inc.). The most preferable anionic surfactant for a liquid carbon black dispersion is MAPHOS 56. Suitable nonionic surfactants include ethoxylated nonyl phenols such as POLY-TERGENT ® B-Series (Olin Corporation) or alkoxylated linear alcohols such as POLY-TERGENT SL-Series (Olin Corporation).

If the total dispersion is acidic, it is preferred to employ selected anionic surfactants or cationic surfactants. An acceptable group of anionic surfactants would be the sodium or potassium salts of naphthalene sulfonic acid described above. Acceptable cationic surfactants include cetyl dimethyl benzyl ammonium chloride such as AMMONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2AI (Dow Chemical); a sodium salt of DDODA such as STRODEX (Dexter Chemical Corporation); and salts of complex organic phosphate esters. Preferred surfactants include amphoteric potassium salts of a complex amino acid based on fatty amines such as MAFO 13 and cationic ethoxylated soya amines such as MAZEEN S-5 or MAZTREAT (Mazer Chemicals Inc.). Combinations of surfactants may be employed. The term "surfactant", as used herein for making the carbon black dispersion, may include other forms of dispersing agents or aids such as low molecular weight polyelectrolytes and polymers.

The amount of carbon black in the dispersion should be less than about 4% by weight of the dispersion, preferably, less than about 2% by weight. It has been found that the use of higher concentrations of carbon blacks provide undesirable plating characteristics. In the same regard, the solids content (i.e. all of the ingredients other than the liquid dispersing medium) is preferably less than 10% by weight of the dispersion, more preferably, less than about 5.6% by weight.

The three above-noted critical components of the present invention, namely, the carbon black, liquid dispersing medium and surfactant, may be employed alone to form a liquid dispersion. In some situations, it may be desirable to add other preferred ingredients to this dispersion.

One additional preferred component of the liquid carbon black-containing dispersion is a strong basic material such as an alkaline hydroxide. Suitable strong basic materials include alkali metal hydroxides such as potassium hydroxide, sodium hydroxide, and lithium hydroxide. Ammonium hydroxide or alkaline earth metal hydroxides such as calcium hydroxide may also be employed, if desired. Potassium hydroxide is the most preferred strong basic material. The term "alkaline hydroxide" is used throughout the description and claims to identify these strong basic materials. Sufficient alkaline hydroxide may be added to the liquid carbon black dispersion in a proportion sufficient to increase the pH of the resulting carbon black-containing dispersion to between about 10 and about 14, and preferably between about 10 and about 12.

Following is a typical formulation of a suitable aqueous alkaline dispersion of carbon black showing the general range of proportions as well as the preferred range of proportions for the various components:

| Component | General Range | Preferred Range |
|---|---|---|
| Carbon Black | 0.1–4% by wt. | 0.15–2% by wt. |
| Surfactant | 0.01–4% | 0.05–2% |
| Alkaline Hydroxide | 0–1% | 0.4–0.8% |
| Water | Balance | Balance |

The liquid dispersion of carbon black is typically placed in a suitably agitated vessel and the printed wiring board to be treated is immersed in, sprayed with or otherwise contacted with the liquid dispersion. The temperature of the liquid dispersion in an immersion bath is maintained in the range of between about 15° C. and about 35° C. and preferably between about 20° C. and about 30° C., while the conditioned printed wiring board is immersed therein. The period of immersion generally ranges from about 1 to 10, and preferably from about 3 to 5 minutes. During immersion, the liquid carbon black-containing dispersion penetrates the holes of the printed wiring board and wets and contacts the glass fiber as well as the epoxy resin which forms the components of the insulating layer. The immersed board is then removed from the liquid carbon black-containing dispersion bath.

The carbon black-covered board is then subjected to a step where substantially all (i.e., more than about 95% by weight) of the water in the applied dispersion is removed and a dried deposit containing carbon black is left in the holes and on other exposed surfaces of the nonconducting layer. This may be accomplished by several methods such as by evaporation at room temperature, by a vacuum, or by heating the board for a short time at an elevated temperature, or by other equivalent means. Heating at an elevated temperature is the preferred method. Heating is generally carried out for between about 30 seconds and 45 minutes at a temperature of from about 75° C. to 120° C., more preferably from about 80° C. to 98° C. To insure complete coverage of the hole walls, the procedure of immersing the board in the liquid carbon black dispersion and then drying may be repeated one or more times.

This drying step yields a board which may be completely coated with the carbon black dispersion. This dispersion is not only coated on the drilled hole surfaces, which is desirable, but also entirely coats the copper plate or foil surfaces which is undesirable. Thus prior to many subsequent operations all carbon black must be removed from the copper plate or foil surfaces.

As an optional feature of the present invention, the dried deposit of carbon black in the through holes is then contacted with an aqueous alkaline solution containing an alkali metal borate. The preferred alkali metal borate is sodium borate. The preferred pH range of this alkaline solution is from about 9.5 to 11.0. The preferred bath temperature is from about 20° C. to 50° C. The functions of this step include removing excess carbon black material on the rims and inner metal walls of the PWB through holes and remove any loose carbon black particles from the through hole walls which might cause an undesirable uneven plated surface to result. The alkali metal borate also increases the surface porosity of the carbon black.

If used, the amount of alkali borate should be sufficient to remove substantially all of the loose or easily removable carbon black particles from the areas of the through holes. The preferred concentration may vary from about 2 to 50 grams per liter of water employed. This contacting step may be carried out by placing the PWB in an aqueous bath containing the alkali metal borate at a temperature from about 20° C. to 50° C. for about 20 seconds to 5 minutes.

The further removal of the carbon black, specifically from the outer copper surfaces including, especially, the rims of the drilled holes while leaving the coating intact on the glass fibers and epoxy surface of the hole walls, may be achieved by the employment of a microetch bath. Generally, this treatment is carried out at a temperature of about 20° C. to 30° C. for 35 seconds to about 3 minutes. One suitable sodium persulfate-based microetch is "BLACKHOLE MICROCLEAN I" available from Olin Hunt Specialty Products Inc. This product is preferably combined with sufficient sulfuric acid to make a microetch bath containing 100–300 grams of sodium persulfate per liter of deionized water and about 1 to 10% by weight sulfuric acid. The mechanism by which this microetch works is by not attacking the carbon black material deposited on the copper foil directly, but rather to attack exclusively the first few atomic layers of copper directly below which provides the adhesion for the coating. Hence, the fully coated board is immersed in the microetch solution to "flake" off the carbon black from the copper surfaces in the form of micro-flakelets. These, micro-flakelets are removed from the microetch bath either by filtration through a pump or via a weir type filter arrangement commonly used in the PWB industry. The liquid carbon black dispersion, the alkali metal borate treatment, the microetch treatment, and the intermittent water rinses are preferably carried out by immersing the PWB in baths constructed of polypropylene or polyvinyl chloride (PVC) and kept agitated by a recirculation pump or pumped in air.

After the microetch step and a subsequent water rinse, the PWB may now either proceed to the photoimaging process and later be electroplated or be directly panel electroplated. It may be preferred to further clean the PWB with a citirc acid anti-tarnish solution or any other acid cleaner solution or both after the above microetch step.

The thus treated printed wiring board is then ready for electroplating operation which includes immersing the PWB in a suitable electroplating bath for applying a copper coating on the hole walls of the nonconducting layer.

The present invention contemplates the use of any and all electroplating operations conventionally employed in applying a metal layer to the through hole walls of a PWB. Therefore, this claimed invention should not be limited to any particular electroplating bath parameters.

A typical copper electroplating bath is comprised of the following components in the following proportions:

| Component | General Proportions | Preferred Proportions |
|---|---|---|
| Copper (as metal) | 2-3 oz/gal | 2.25-2.75 oz/gal |
| Copper Sulfate | 5-10 oz/gal | 6-9 oz/gal |
| 98% Concentrated H$_2$SO$_4$ (by weight) | 23-32 oz/gal | 27-30 oz/gal |
| Chloride Ion | 20-100 mg/l | 40-60 mg/l |

The electroplating bath is normally agitated and preferably maintained at a temperature of between about 20° C. and 25° C. The electroplating bath is provided with anodes, generally constructed of copper, and the printed wiring board to be plated is connected as a cathode to the electroplating circuit. For example, a current of about 30 amps per square foot is impressed across the electroplating circuit for a period of between about 40 and 60 minutes in order to effect copper plating on the hole walls of the nonconducting layer positioned between the two plates of copper up to a thickness of about 1 mil ±0.2 mil. This copper plating of the hole wall provides a current path between the copper layers of the printed wiring board. Other suitable electroplating conditions may be employed, if desired. Other electroplating bath compositions containing other copper salts or other metal salts such as salts of nickel, gold, palladium, silver and the like may be employed, if desired.

The printed wiring board is removed from the copper electroplating bath and then washed and dried to provide a board which is further processed. For example, the PWB may be subjected to a tin-lead electroplating operation.

EXAMPLES

The following examples are presented to define the invention more fully without any intention of being limited thereby:

EXAMPLE 1

PREPARATION OF POLYANILINE SALTS

The polyaniline salt was made by oxidizing Aniline Hydrochloride with Ammonium Persulfate according to the procedures described by Chiang et al., *Synthetic Metals*, 13, 193-205 (1986) and Hagiwara, et al., *synthetic Metals*, 18, 317-322 (1987), both of which are incorporated herein by reference. It should be noted that the salt was not isolated but left as a dispersion in the green-colored liquid.

EXAMPLE 2

PREPARATION OF CARBON BLACK/POLYANILINE DISPERSION

To the polyaniline hydrochloride solution/dispersion, prepared as in Example 1 by adding 368.4 grams of a 1M solution of ammonium persulfate to 211 grams of an 0 3M solution of aniline hydrochloride and 2.5% HCl, was added 25 grams of Raven 3500 Carbon Black, available from Columbian. The mixture was stirred overnight using a magnetic stirrer.

PWB samples for subsequent electroplating were placed into the stirred dispersion. Following a number of such treatments, the dispersion was filtered giving a clear supernate indicating that most of the soluble polyaniline salts were associated with the carbon black.

EXAMPLE 3

A double-sided printed wiring board (0.0013 in copper foil, laminated to opposite sides of an epoxy resin/fiberglass composite; total thickness=0.0625 in.) with various sized holes (0.02-0.2 in. diameter) drilled through, were prepared for electroplating by first mechanically scrubbing the copper surfaces of the board.

The board was subsequently cleaned by immersing it in "BLACKHOLE Cleaner 2", available from Olin Hunt Specialty Products, West Paterson, N.J., for 5 min. at 60° C., followed by a 2 min. water rinse to remove grease and other impurities from the surface of the board. When dried, the electrical resistance of the through-holes was measured using a digital voltmeter with leads attached to each side of the board. Resistance was greater than $1 \times 10^{10}$ ohms.

The board was then immersed into an aqueous dispersion of carbon black which had been previously treated with a solution of the reaction product of Aniline Hydrochloride and Ammonium Persulfate as described in Example 2 (5 min. at 21° C.). The board was then rinsed with water and dried at 110° C. for 20 min. Through hole resistance, measured as above, was 50 ohms.

The board was then immersed in a sodium persulfate microetch (BLACKHOLE MICROCLEAN I available from Olin Hunt Specialty Products, West Paterson, N.J.) for 30 sec. at 21° C. in order to remove the carbon black film from the copper surfaces. The board was rinsed and dried as above. Through-hole resistance was 500 ohms.

The board was then placed into an electroplating bath provided with an agitation means and a heating means and which contained an electrolyte bath comprised of the following components:

| Plating Bath Composition | |
|---|---|
| Component | Proportions |
| Copper (as metal) | 2.5 oz./gal. |
| Copper sulfate | 6.2 oz./gal. |
| 98% Concentrated H$_2$SO$_4$ | 30 oz./gal. |
| Chloride ion | 40 mgm./liter |

The board was connected as the cathode in the electroplating vessel. A copper coupon was immersed in the bath and connected as the anode. A direct current of 30 amps/ft.$^2$ was impressed across the electrodes in the plating bath for approximately 55 minutes. The bath was maintained at a temperature of about 25° C. and agitation was effected by air sparging. At the end of this period, the board was removed from the electrolyte washed with tap water and dried.

When compared to a similar sample process in conventional Blackhole Processing Chemistry available from Olin Hunt Specialty Products, West Paterson, N.J., the holes processed in the carbon black/polyaniline dispersion were found to have more uniform copper deposition in the smaller, higher aspect ratio holes than those from the Blackhole Process. This indicates that the carbon black/polyaniline coating plates faster than the BLACKHOLE coating.

EXAMPLE 4

A double-side copper foil-epoxy resin/fiberglass PWB board was etched so that the copper was completely removed from 90% of the surface, leaving a thin strip of copper at one end of the board. The board was then cut into smaller coupons approximately 1 in. by 6 in. with a half inch strip of copper foil at one end.

The coupons were cleaned as in Example 3. One sample was immersed into the carbon black/polyaniline dispersion described in Example 2 for 5 min. at 21° C. A second sample was immersed for 5 min. in an aqueous carbon black dispersion, BLACKHOLE ™, available from Olin Hunt Specialty Products, West Paterson, N.J. Both samples were dried at 95° C. for 20 min.

The samples were then placed into a copper electroplating bath as described in Example 3. Direct current was impressed across the electrodes, 2.5 amps or 30 amps/ft.$^2$ for 10 min. Growth of a copper film out from the cathode was measured on both samples. The copper film grown on the carbon black/polaniline coating was longer and more uniform than the BLACKHOLE coated laminate indicating a faster plating rate.

What is claimed is:

1. In the process for electroplating a conductive metal layer to the surface of a nonconductive material, which comprises the following steps:
   (a) preparing a liquid dispersion of carbon black comprised of:
   (1) carbon black particles having an average particle diameter of less than about 3.0 microns in said dispersion;
   (2) an effective dispersing amount of a surfactant which is compatible with said carbon black; and
   (3) liquid dispersing medium, wherein the amount of carbon black is sufficient to coat substantially all of said nonconducting surfaces and is less than about 4% by weight of said liquid dispersion;
   (b) applying said liquid dispersion to the surface of the nonconducting material;
   (c) separating substantially all of said liquid dispersing medium from said carbon black particles, whereby said particles are deposited on said nonconductive surface in a substantially continuous layer; and
   (d) electroplating a substantially continuous conductive metal layer over the deposited carbon black layer and said nonconductive surface, wherein said improvement comprises:
   adding an organic ionomer or polymer salt, or combinations thereof, to the liquid dispersion in step (a).

2. A process as defined in claim 1, wherein the salt is selected from the salts of polyaniline, polyethyleneimines, sulfonated petroleum, 3-alkylpolythiopene, polypyrrole, poly(N-alkyl pyrrole), poly(3-alkyl pyrrole), polyisophianaphthlene, polyphosphagene, polyacetylene, and combinations thereof.

3. A process as defined in claim 1, wherein the salt is polyaniline hydrochloride.

4. A process as defined in claim 1, wherein the salt is polyaniline sulfate.

5. A process as defined in claim 1, wherein the salt is a quaternary polyethyleneimine.

6. A process as defined in claim 1, wherein the salt is a barium salt of sulfonated petroleum.

7. In the process for electroplating a conductive metal layer to the surface of a nonconductive material, which comprises the following steps:
   (a) preparing a liquid dispersion of carbon black comprised of:
   (1) carbon black particles having an average particle diameter of less than about 3.0 microns in said dispersion;
   (2) an effective dispersing amount of a surfactant which is compatible with said carbon black; and
   (3) liquid dispersing medium, wherein the amount of carbon black is sufficient to coat substantially all of said nonconducting surfaces and is less than about 4% by weight of said liquid dispersion;
   (b) applying said liquid dispersion to the surface of the nonconducting material;
   (c) separating substantially all of said liquid dispersing medium from said carbon black particles, whereby said particles are deposited on said nonconductive surface in a substantially continuous layer; and
   (d) electroplating a substantially continuous conductive metal layer over the deposited carbon black layer and said nonconductive surface, wherein said improvement comprises:
   treating the carbon black particles in step (a)(1) with an organic ionomer or polymer salt.

8. A process as defined in claim 7, wherein the salt is selected from the salts of polyaniline, polyethyleneimines, sulfonated petroleum, 3-alkylpolythiopene, polypyrrole, poly(N-alkyl pyrrole), poly(3-alkyl pyrrole), polyisophianaphthlene, polyphosphagene, polyacetylene, and combinations thereof.

9. A process as defined in claim 7, wherein the salt is polyaniline hydrochloride.

10. A process as defined in claim 7, wherein the salt is polyaniline sulfate.

11. A process as defined in claim 7, wherein the salt is a quaternary polyethyleneimines.

12. A process as defined in claim 7, wherein the salt is a barium salt of sulfonated petroleum.

13. A process as defined in claim 7 wherein the carbon black is treated prior to step (a).

14. A process as defined in claim 13, wherein the carbon black is coated with a solution of the organic ionomer or polymer salt.

15. In the process for electroplating the walls of through holes in a laminated printed wiring board comprised of at least one nonconducting layer laminated to at least two separate conductive metal layers, which comprises the steps:
   (a) contacting said printed wiring board having said through holes with a liquid dispersion of carbon black comprised of:
   (1) carbon black particles having an average particle size of less than about 3 0 microns in said dispersion;
   (2) an effective dispersing amount of a surfactant which is compatible with said carbon black; and
   (3) liquid dispersing medium, wherein the amount of carbon black is sufficient to coat substantially all of said nonconducting surfaces and is less than about 4% by weight of said liquid dispersion;
   (b) separating substantially all of said liquid dispersing medium from said applied dispersion, thereby depositing said carbon black particles in a substantially continuous layer on said nonconducting portions of said hole walls;
   (c) microetching said metal layers of said printed wiring board to remove deposited carbon black therefrom; and
   (d) later electroplating a substantially continuous metal layer over the deposited carbon black layer on said nonconducting portions of hole walls, thereby electrically connecting said metal layers of said printed wiring board;
   wherein said improvement comprises:
   adding an organic ionomer or polymer salt, or combinations thereof, to the liquid dispersion in step (a).

16. A process as defined in claim 15, wherein the salt is selected from the salts of polyaniline, polyethyleneimines, sulfonated petroleum, 3-alkylpolythiopene, polypyrrole, poly(N-alkyl pyrrole), poly(3-alkyl pyrrole), polyisophianaphthlene, polyphosphagene, polyacetylene, and combinations thereof.

17. A process as defined in claim 15, wherein the salt is polyaniline hydrochloride.

18. A process as defined in claim 15, wherein the salt is polyaniline sulfate.

19. A process as defined in claim 15, wherein the salt is a quaternary polyethyleneimines.

20. A process as defined in claim 15, wherein the salt is a barium salt of sulfonated petroleum.

21. In the process for electroplating the walls of through holes in a laminated printed wiring board comprised of at least one nonconducting layer laminated to at least two separate conductive metal layers, which comprises the steps:
  (a) contacting said printed wiring board having said through holes with a liquid dispersion of carbon black comprised of:
    (1) carbon black particles having an average particle size of less than about 3.0 microns in said dispersion;
    (2) an effective dispersing amount of a surfactant which is compatible with said carbon black; and
    (3) liquid dispersing medium, wherein the amount of carbon black is sufficient to coat substantially all of said nonconducting surfaces and is less than about 4% by weight of said liquid dispersion;
  (b) separating substantially all of said liquid dispersing medium from said applied dispersion, thereby depositing said carbon black particles in a substantially continuous layer on said nonconducting portions of said hole walls;
  (c) microetching said metal layers of said printed wiring board to remove deposited carbon black therefrom; and
  (d) later electroplating a substantially continuous metal layer over the deposited carbon black layer on said nonconducting portions of hole walls, thereby electrically connecting said metal layers of said printed wiring board;
wherein said improvement comprises:
  treating the carbon black particles in step (a)(1) with an organic ionomer or polymer salt.

22. A process as defined in claim 21, wherein the salt is selected from the salts of polyaniline, polyethyleneimines, sulfonated petroleum, 3-alkylpolythiopene, polypyrrole, poly(N-alkyl pyrrole), poly(3-alkyl pyrrole), polyisophianaphthlene, polyphosphagene, polyacetylene, and combinations thereof.

23. A process as defined in claim 21, wherein the salt is polyaniline hydrochloride.

24. A process as defined in claim 21, wherein the salt is polyaniline sulfate.

25. A process as defined in claim 21, wherein the salt is a quaternary polyethyleneimines.

26. A process as defined in claim 21, wherein the salt is a barium salt of sulfonated petroleum.

27. A process as defined in claim 21 wherein the carbon black is treated prior to step (a).

28. A process as defined in claim 27, wherein the carbon black is coated with a solution of the organic ionomer or polymer salt.

* * * * *